(12) United States Patent
Leobandung

(10) Patent No.: US 10,103,237 B2
(45) Date of Patent: Oct. 16, 2018

(54) INVERTED MOSFET WITH SCALING ADVANTAGE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/444,617

(22) Filed: Feb. 28, 2017

(65) Prior Publication Data

US 2018/0248014 A1    Aug. 30, 2018

(51) Int. Cl.
| H01L 29/423 | (2006.01) |
| H01L 29/786 | (2006.01) |
| H01L 29/66 | (2006.01) |

(52) U.S. Cl.
CPC .. *H01L 29/42392* (2013.01); *H01L 29/66742* (2013.01); *H01L 29/78618* (2013.01); *H01L 29/78696* (2013.01); *H01L 2029/42388* (2013.01)

(58) Field of Classification Search
CPC ......... H01L 29/42392; H01L 29/66742; H01L 29/78618; H01L 29/78696
See application file for complete search history.

(56) References Cited

U.S. PATENT DOCUMENTS

| 8,541,274 | B1 * | 9/2013 | Xie | H01L 21/845 257/E21.635 |
| 2011/0156107 | A1 * | 6/2011 | Bohr | H01L 21/76831 257/288 |
| 2014/0170331 | A1 * | 6/2014 | Kyomoto | A61F 2/30767 427/512 |
| 2014/0179102 | A1 * | 6/2014 | Joung | H01L 21/764 438/666 |
| 2015/0021683 | A1 * | 1/2015 | Xie | H01L 29/6653 257/330 |
| 2015/0041899 | A1 * | 2/2015 | Yang | H01L 27/0922 257/351 |
| 2015/0243773 | A1 * | 8/2015 | Basu | H01L 29/205 257/194 |
| 2015/0380489 | A1 * | 12/2015 | Chan | H01L 27/0886 257/192 |
| 2016/0118472 | A1 * | 4/2016 | Qi | H01L 29/66553 438/283 |
| 2016/0365440 | A1 * | 12/2016 | Suk | H01L 29/785 |
| 2017/0148897 | A1 * | 5/2017 | Cheng | H01L 29/66666 |
| 2017/0271335 | A1 * | 9/2017 | Yang | H01L 27/0922 |
| 2017/0309725 | A1 * | 10/2017 | Duriez | H01L 29/78696 |

* cited by examiner

*Primary Examiner* — Christine Enad
(74) *Attorney, Agent, or Firm* — Scully, Scott, Murphy & Presser, P.C.; L. Jeffrey Kelly, Esq.

(57) ABSTRACT

After forming a gate structure wrapping around a suspended channel portion of a semiconductor fin located on an insulator layer, a gate cap is formed atop the gate structure. Portions of an interlevel dielectric (ILD) layer laterally surrounding the gate structure and the gate cap are then removed to form source/drain contact openings. Epitaxial source/drain regions are subsequently grown from surfaces of the semiconductor fin exposed by the source/drain contact opening. Next, source/drain contact structures are formed on top of the epitaxial source/drain regions. Entire sidewalls of the source/drain contact structure are in contact with the gate cap.

17 Claims, 10 Drawing Sheets

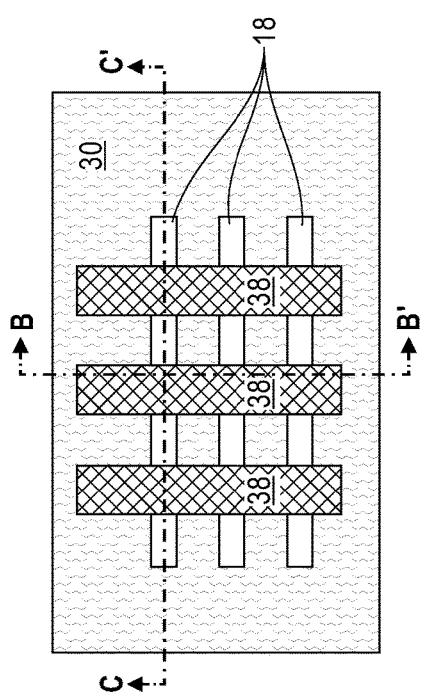
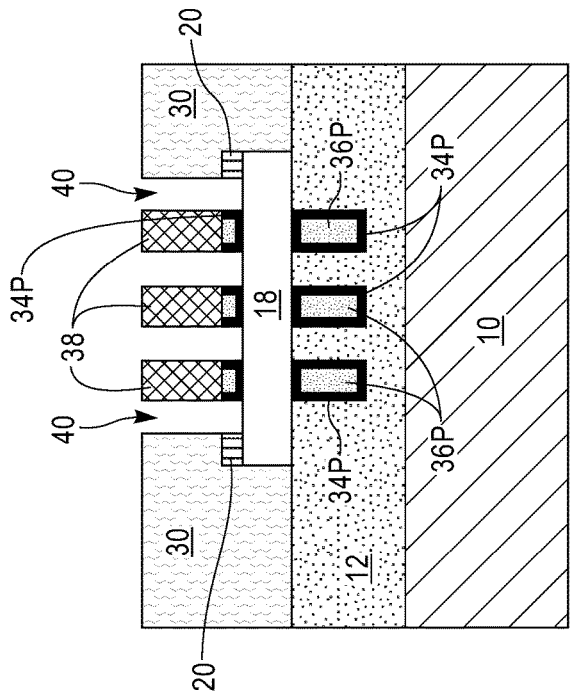
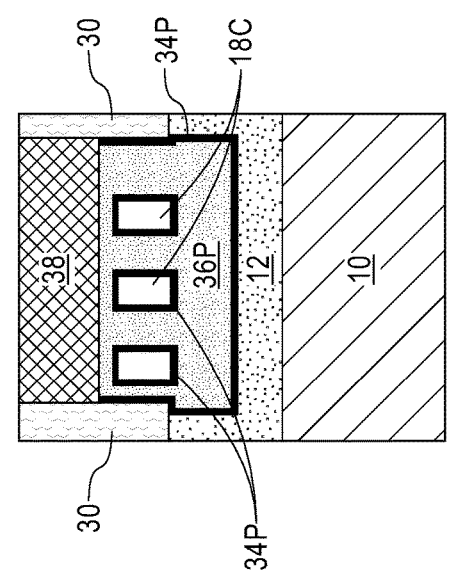
FIG. 7A
FIG. 7B
FIG. 7C

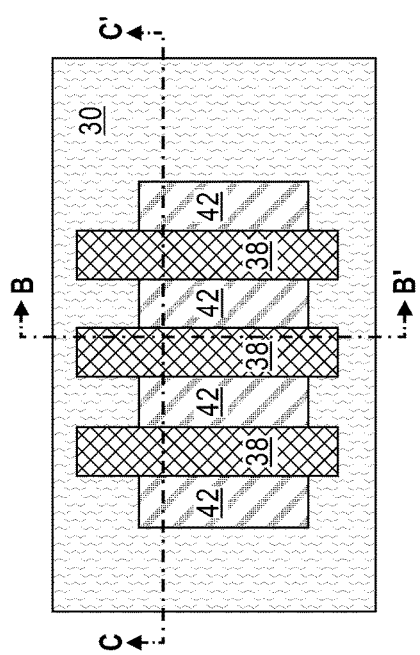
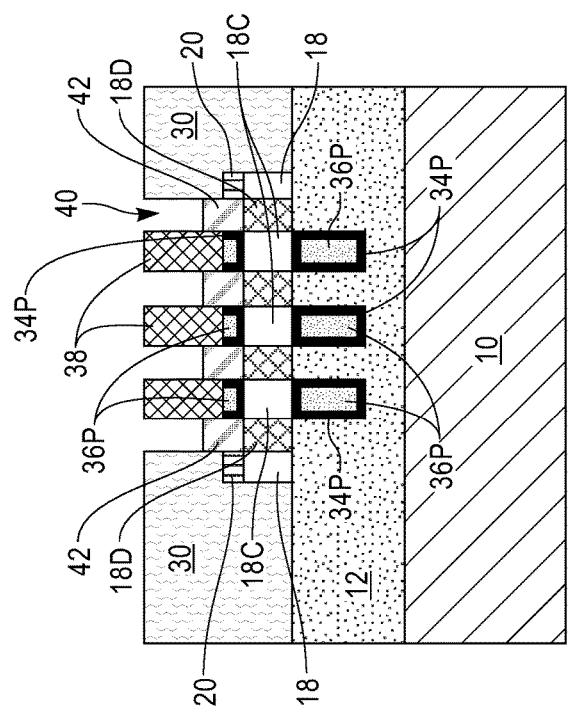
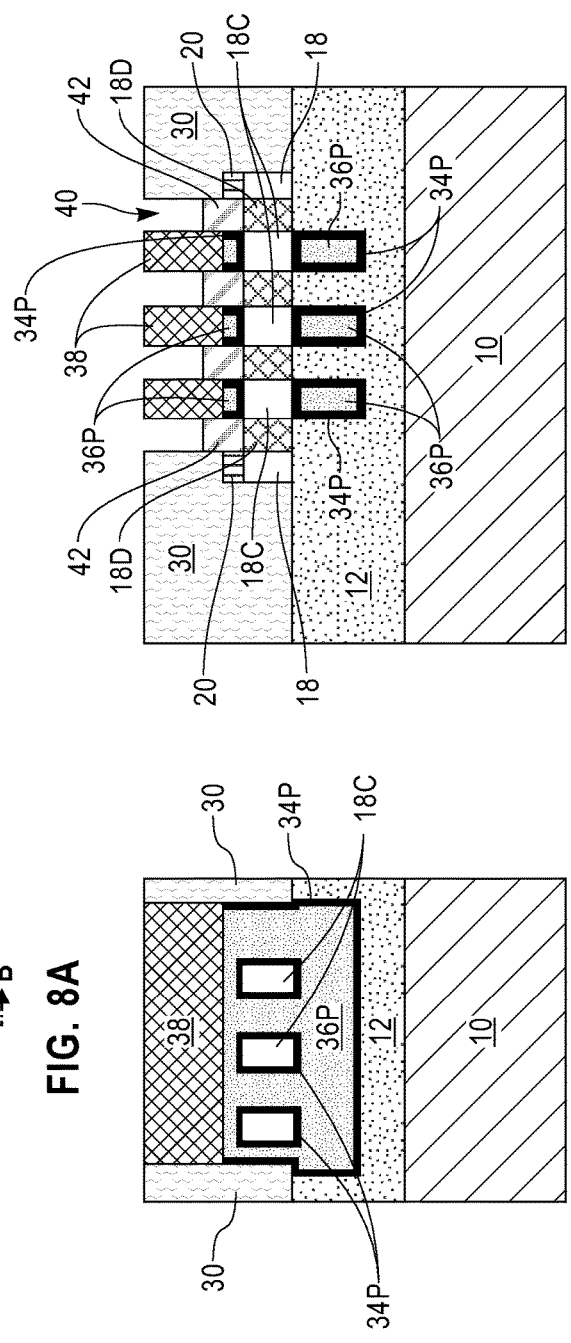
FIG. 8A
FIG. 8B
FIG. 8C

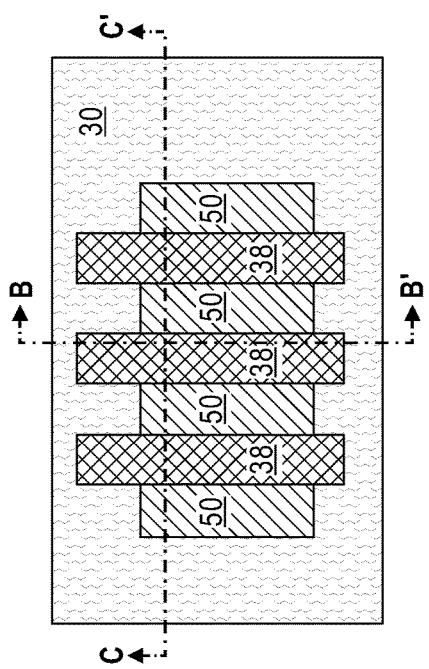
FIG. 9A
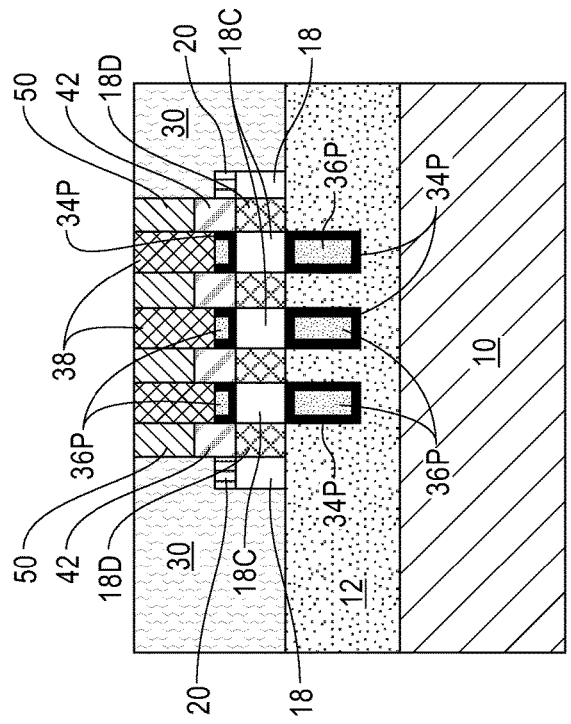
FIG. 9B
FIG. 9C

US 10,103,237 B2

1

INVERTED MOSFET WITH SCALING ADVANTAGE

BACKGROUND

The present application relates to semiconductor device fabrication, and more particularly to formation of metal-oxide-semiconductor field effect transistors (MOSFETs) with improved scaling and reduced parasitic capacitance.

In the semiconductor industry, there is a constant demand to increase the operating speed of integrated circuits (ICs). The demand for increased speed, in turn, has resulted in a continual size reduction of the semiconductor devices including field effect transistors (FETs). However, the aggressive scaling or size reduction of the FETs raises various technical issues relating to contact spacing and parasitic capacitance, namely gate-to-source/drain contact capacitance, which need to be addressed in order to meet the requirements for both device performance and manufacturing yield.

SUMMARY

The present application provides an inverted MOSFET with improved scaling and reduced parasitic capacitance. The inverted MOSFET includes a gate structure having a lower portion formed beneath a channel region of a semiconductor fin and an upper portion formed above the channel region, and a gate cap located on the gate structure. The height of the upper portion of the gate structure is selected such that the source/drain contact structures only contact the gate cap, but not the gate structure. Such a device structure allows minimization of overlap between the gate structure and source/drain contact structure, which leads to reduced parasitic capacitance.

According to an aspect of the present application, a semiconductor structure is provided. The semiconductor structure includes a semiconductor fin located over a substrate, a gate structure wrapping around a channel region of the semiconductor fin, a gate cap located on the gate structure, epitaxial source/drain regions located on portions of the semiconductor fin that laterally surround the channel region, and source/drain contact structures located on the epitaxial source/drain regions. Entire sidewalls of the source/drain contact structures are in contact with sidewalls of the gate cap.

According to another aspect of the present application, a method of forming a semiconductor structure is provided. The method includes first forming an interlevel dielectric (ILD) layer over a semiconductor fin located on a substrate. A gate trench is then formed extending through the ILD layer and into the substrate such that a channel region of the semiconductor fin is suspended in the gate trench. After forming a gate structure within the gate trench and wrapping around the channel region of the semiconductor fin, a gate cap is formed on the gate structure and within the gate trench. Source/drain contact openings are then formed extending through the ILD layer to expose portions of the semiconductor fin on opposite sides of the gate structure. After forming epitaxial source/drain regions on the exposed portions of the semiconductor fin, source/drain contact structures are formed on the epitaxial source/drain regions and within the source/drain contact opening. Entire sidewalls of the source/drain contact structures are in contact with sidewalls of the gate cap.

2

BRIEF DESCRIPTION OF SEVERAL VIEWS OF THE DRAWINGS

FIG. 7A is a top-down view of the exemplary semiconductor structure of FIGS. 6A-6C after forming source/drain contact openings on opposite sides of the gate structures.

FIG. 7B is a cross-sectional view of the exemplary semiconductor structure of FIG. 7A along line B-B'.

FIG. 7C is a cross-sectional view of the exemplary semiconductor structure of FIG. 7A along line C-C'.

FIG. 8A is a top-down view of the exemplary semiconductor structure of FIGS. 7A-7C after forming epitaxial source/drain regions within the source/drain contact openings.

FIG. 8B is a cross-sectional view of the exemplary semiconductor structure of FIG. 8A along line B-B'.

FIG. 8C is a cross-sectional view of the exemplary semiconductor structure of FIG. 8A along line C-C'.

FIG. 9A is a top-down view of the exemplary semiconductor structure of FIGS. 8A-8C after forming source/drain contact structures on top of the epitaxial source/drain regions.

FIG. 9B is a cross-sectional view of the exemplary semiconductor structure of FIG. 9A along line B-B'.

FIG. 9C is a cross-sectional view of the exemplary semiconductor structure of FIG. 9A along line C-C'.

DETAILED DESCRIPTION

Figure 1A:
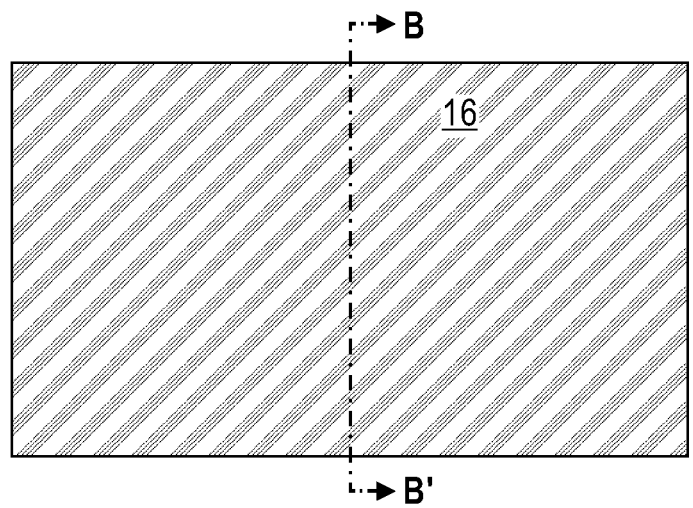
FIG. 1A is a top-down view of an exemplary semiconductor structure including a dielectric cap layer formed over a semiconductor-on-insulator (SOI) substrate according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
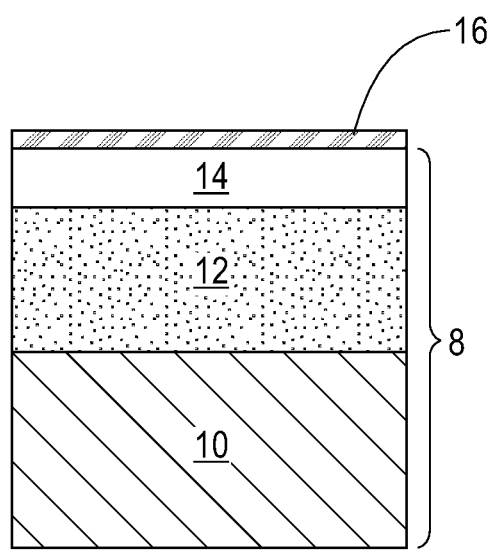
FIG. 1B is a cross-sectional view of the exemplary semiconductor structure of FIG. 1A along line B-B'.

Referring to FIGS. 1A and 1B, an exemplary semiconductor structure according to an embodiment of the present application is provided. The semiconductor structure includes a semiconductor-on-insulator (SOI) substrate 8 and a dielectric cap layer 16 formed over the SOI substrate 8. As shown in FIG. 1B, the SOI substrate 8 includes, from bottom to top, a handle substrate 10, a buried insulator layer 12 and a top semiconductor layer 14.

The handle substrate 10 may include a semiconductor material, such as, for example, silicon (Si), silicon germanium (SiGe), silicon germanium carbide (SiGeC), silicon carbide (SiC), an III-V compound semiconductor, an II-VI compound semiconductor, or any combinations thereof. Multilayers of semiconductor materials can also be used as the semiconductor material of the handle substrate 10. In one embodiment, the handle substrate 10 is composed of single crystalline silicon. The thickness of the handle substrate 10 can be from 50 μm to 2 mm, although lesser and greater thicknesses can also be employed.

The buried insulator layer 12 that is formed on the handle substrate 10 may include a dielectric material such as silicon dioxide, silicon nitride, silicon oxynitride, or a combination thereof. The buried insulator layer 12 may be formed using a deposition process including, but not limited to, chemical vapor deposition (CVD), plasma enhanced chemical vapor deposition CVD (PECVD), or physical vapor deposition (PVD). Alternatively, the buried insulator layer 12 may be formed by thermal nitridation and/or thermal oxidation of a surface portion of the handle substrate 10. The buried insulator layer 12 may also be formed by implanting oxygen atoms into a bulk semiconductor substrate and thereafter annealing the structure. The thickness of the buried insulator layer 12 can be from 100 nm to 300 nm, although lesser and greater thicknesses can also be employed.

The top semiconductor layer 14 may include any semiconductor material as mentioned above for the handle substrate 10. Exemplary semiconductor materials that can be employed as the top semiconductor layer include, but are not limited to, Si, Ge, SiGe, SiC, and SiGeC, and III/V compound semiconductors such as, for example, InAs, GaAs, and InP. The semiconductor materials of the top semiconductor layer 14 and the handle substrate 10 may be the same or different. In one embodiment, the top semiconductor layer 14 includes single crystalline silicon. The top semiconductor layer 14 may be formed by CVD or PECVD. The thickness of the top semiconductor layer 14 can be from 20 nm to 50 nm, although lesser or greater thicknesses can also be employed. Alternatively, the top semiconductor layer 14 may be formed using a Smart Cut process where two semiconductor wafers are bonded together with an insulator in between.

The dielectric cap layer 16 that is formed on the top semiconductor layer 14 may include a dielectric material such as, for example, silicon dioxide, silicon nitride, silicon oxynitride, a dielectric metal oxide, or a combination thereof. In one embodiment, the dielectric cap layer 16 is composed of silicon dioxide. The dielectric cap layer 16 may be formed by a deposition process including CVD, PECVD, or PVD, or by a thermal growing process such as thermal oxidation or thermal nitridation. The thickness of the dielectric cap layer 16 can be from 5 nm to 20 nm, although lesser and greater thicknesses can also be employed. The dielectric cap layer 16 is optional and can be omitted in some embodiments of the present application.

Figure 2A:
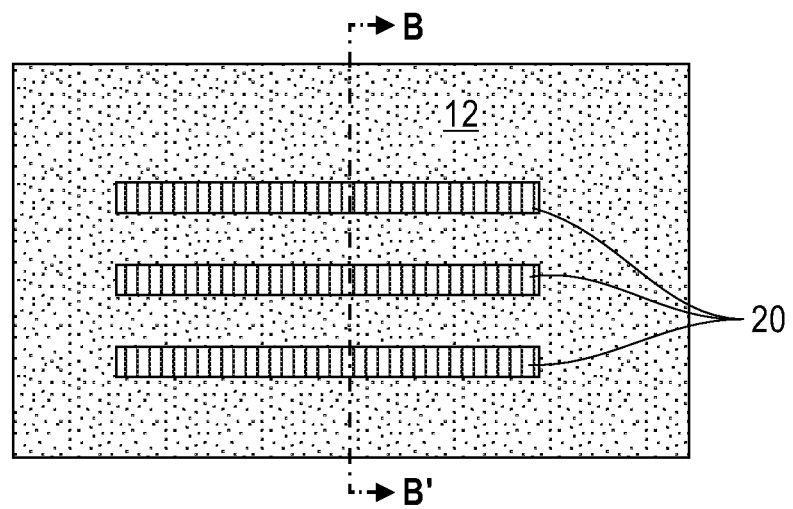
FIG. 2A is a top-down view of the exemplary semiconductor structure of FIGS. 1A and 1B after forming a plurality of fin stacks on a buried insulator layer of the SOI substrate; each fin stack includes a semiconductor fin and a fin cap atop the semiconductor fin.
Figure 2B:
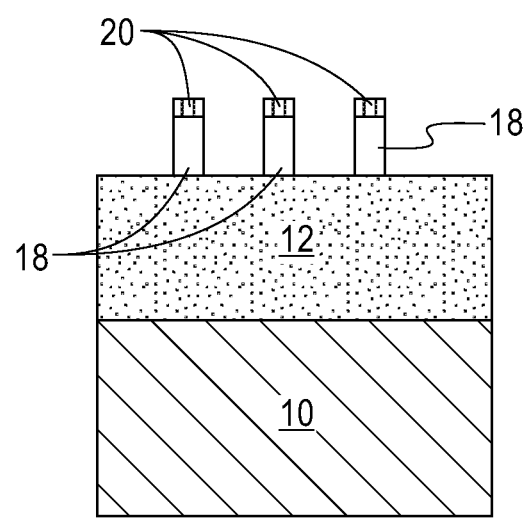
FIG. 2B is a cross-sectional view of the exemplary semiconductor structure of FIG. 2A along line B-B'.

Referring now to FIGS. 2A and 2B, there are illustrated the exemplary semiconductor structure of FIGS. 1A and 1B after forming a plurality of fin stacks on the buried insulator layer 12. Each fin stack includes a semiconductor fin 18 and a fin cap 20 atop the semiconductor fin 18.

The fin stacks (18, 20) can be formed by patterning the dielectric cap layer 16 and the top semiconductor layer 14. For example, a photoresist layer (not shown) can be applied over a top surface of the dielectric cap layer 16 and lithographically patterned to provide a patterned photoresist layer atop portions of the dielectric cap layer 16. Portions of the dielectric cap layer 16 that are not covered by the patterned photoresist layer are subsequently removed by an anisotropic etch, exposing portions of the top semiconductor layer 14. The anisotropic etch can be a dry etch such as, for example, reactive ion etch (RIE) or a wet etch including a chemical etchant that removes the dielectric material of the dielectric cap layer 16 selective to the semiconductor material of the top semiconductor layer 14. Remaining portions of the dielectric cap layer after the lithographic patterning constitute the fin caps 20. Another anisotropic etch is then performed to remove the exposed portions of the top semiconductor layer 14 utilizing the fin caps 20 as an etch mask. Remaining portions of the top semiconductor layer 14 after the lithographic patterning constitute the semiconductor fins 20. After transferring the pattern in the photoresist layer into the dielectric cap layer 16 and the top semiconductor layer 14, the patterned photoresist layer can be removed utilizing a conventional resist stripping process such as, for example, ashing. Other methods known in the art, such as sidewall image transfer (SIT) or directional self-assembly (DSA), can also be used to pattern the dielectric cap layer 16 and the top semiconductor layer 14.

Figure 3A:
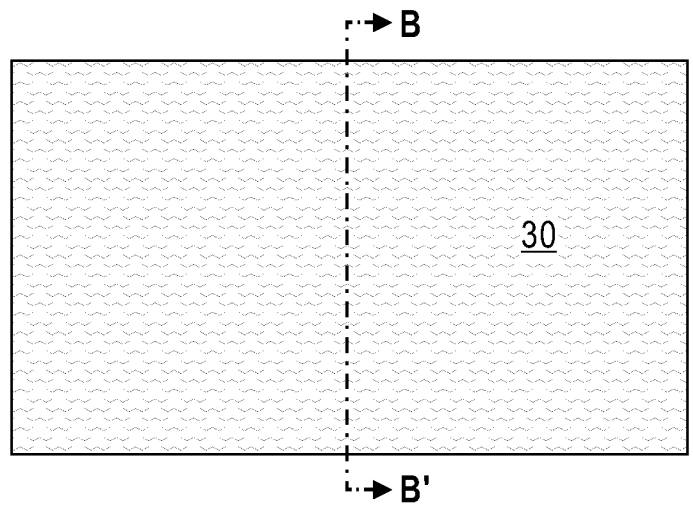
FIG. 3A is a top-down view of the exemplary semiconductor structure of FIGS. 2A and 2B after forming an interlevel dielectric (ILD) layer over the buried insulator layer and fin stacks.
Figure 3B:
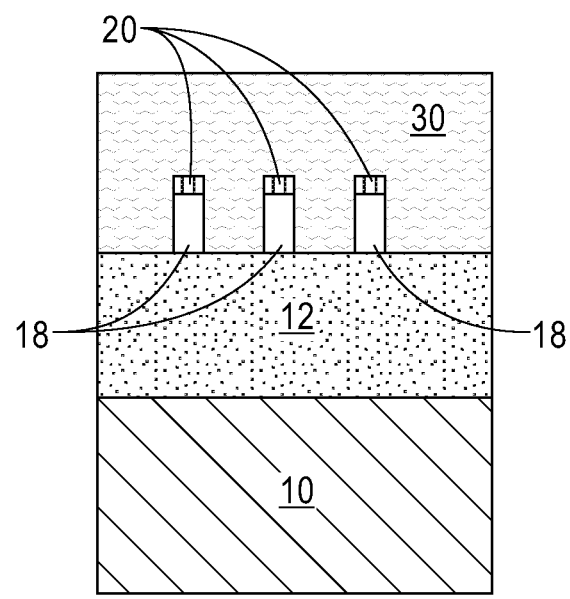
FIG. 3B is a cross-sectional view of the exemplary semiconductor structure of FIG. 3A along line B-B'.

Referring now to FIGS. 3A and 3B, there are illustrated the exemplary semiconductor structure of FIGS. 2A and 2B after forming an interlevel dielectric (ILD) layer 30 over the buried insulator layer 12 and fin stacks (18, 20). The ILD layer 30 includes a dielectric material that is self-planarizing or can be planarized, for example, by chemical mechanical polishing (CMP). For example, the ILD layer 30 may include silicon dioxide, silicon nitride, silicon oxynitride or organosilicate glass (OSG). The ILD layer 30 may be formed, for example, by CVD, ALD, PVD, or spin coating. The ILD layer 30 is deposited to a thickness such that an entirety of the top surface of the ILD layer 30 is formed above the top surfaces of the fin caps 20. In one embodiment, the thickness of the ILD layer 30 can be from 100 nm to 200 nm, although lesser and greater thicknesses can also be employed.

Figure 4A:
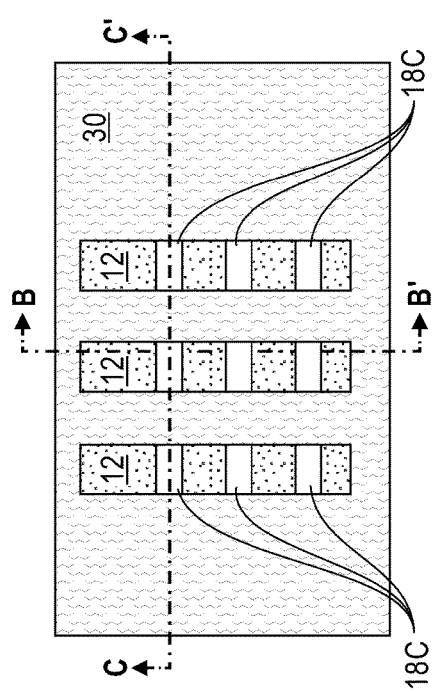
FIG. 4A is a top-down view of the exemplary semiconductor structure of FIGS. 3A and 3B after forming a plurality of gate trenches that extend through the ILD layer and the fin caps and into the buried insulator layer.
Figure 4B:
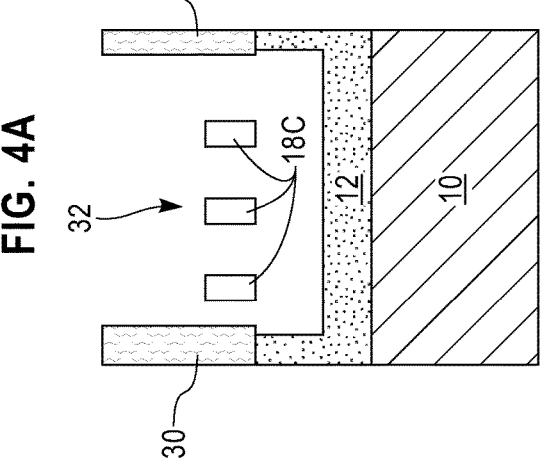
FIG. 4B is a cross-sectional view of the exemplary semiconductor structure of FIG. 4A along line B-B'.
Figure 4C:
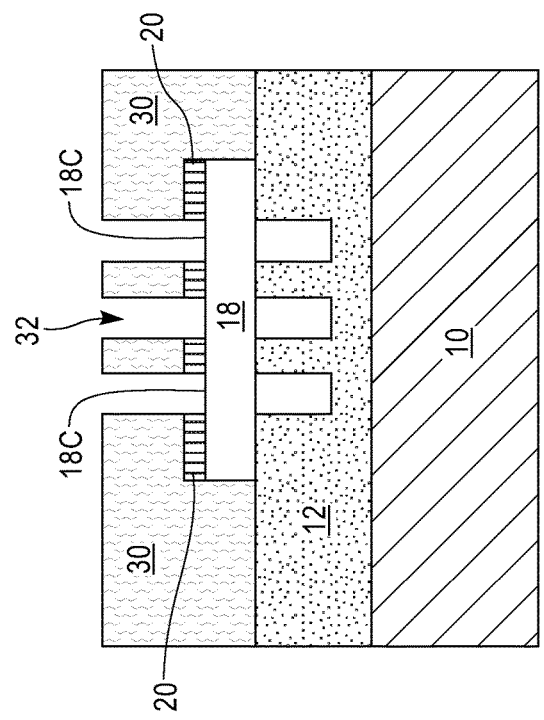
FIG. 4C is a cross-sectional view of the exemplary semiconductor structure of FIG. 4A along line C-C'.

Referring now to FIGS. 4A-4C, there are illustrated the exemplary semiconductor structure of FIGS. 3A and 3B after forming gate trenches 32 extending through the ILD layer 30 and the fin caps 20 and into the buried insulator layer 12. A channel region 18C of each semiconductor fin 18 is suspended within a respective gate trench 32. A distance between a bottom surface of each gate trench 32 and the bottom surface of the channel region 18C of each semiconductor fin 18 can be from 20 nm to 30 nm, although lesser and greater distances can also be employed.

The gate trenches 32 can be formed by lithography and etching. The lithographic process includes forming a photoresist layer (not shown) over the ILD layer 30, exposing the photoresist layer to a desired pattern of radiation and developing the exposed photoresist layer utilizing a conventional resist developer. An anisotropic etch is then performed to remove portions of the ILD layer 30, the fin caps 20 and the buried insulator layer 12 that are not covered by the patterned photoresist layer. The anisotropic etch can be a dry etch, such as, for example, RIE or a wet chemical etch that removes the dielectric materials of the ILD layer 30, the fin caps 20 and the buried insulator layer 12 selective to the semiconductor material of the semiconductor fins 18. The exposed portions of the buried insulator layer 12 thus are recessed relative to the top surface of the buried insulator layer 12.

Subsequently, a portion of the buried insulator layer 12 beneath a channel region 18C of each semiconductor fin 20 exposed by a respective gate trench 32 is removed. A 'short' isotropic etch can be performed to undercut the buried insulator layer 12 from beneath each side of the channel regions 18C. By 'short' it is meant that the etch is performed for a time period of 60 seconds or less depending on the concentration of the etchant used. In one embodiment and when the semiconductor fins 18 are composed of silicon and the buried insulator layer 12 is composed of silicon dioxide, a buffered oxide etch comprising hydrogen fluoride (HF) can be utilized. In the present application, and since the fin width is small, a slight undercut (about ½ fin width) ensures complete removal of the portion of the buried insulator layer 12 beneath each channel region 18C of the semiconductor fins 18. The channel regions 18C of the semiconductor fins 18 are thus suspended in the gate trench 32. After formation of gate trenches 32, the patterned photoresist layer can be removed, for example, by ashing.

Figure 5C:
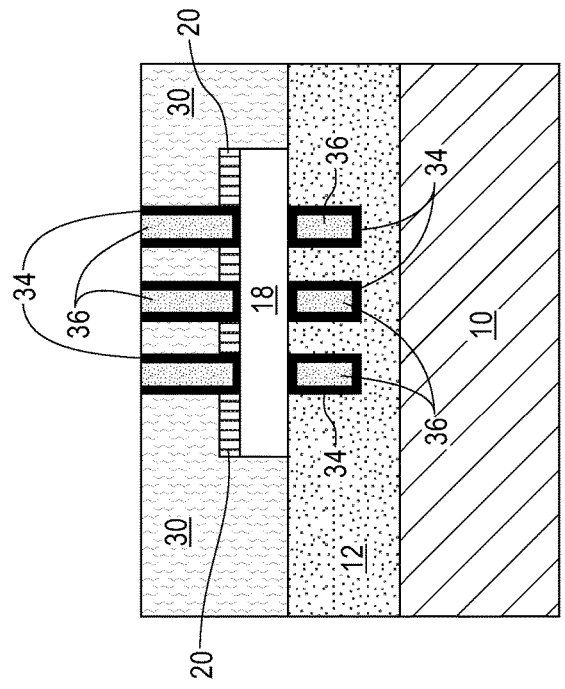
FIG. 5C is a cross-sectional view of the exemplary semiconductor structure of FIG. 5A along line C-C'.
Figure 5A:
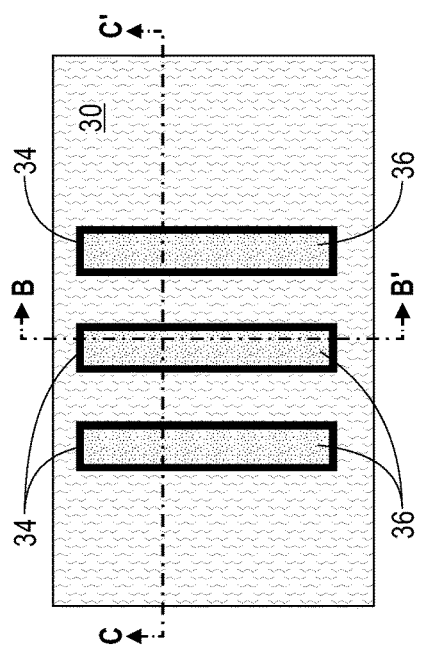
FIG. 5A is a top-down view of the exemplary semiconductor structure of FIGS. 4A-4C after forming a gate dielectric layer portion and a gate electrode layer portion within each gate trench.
Figure 5B:
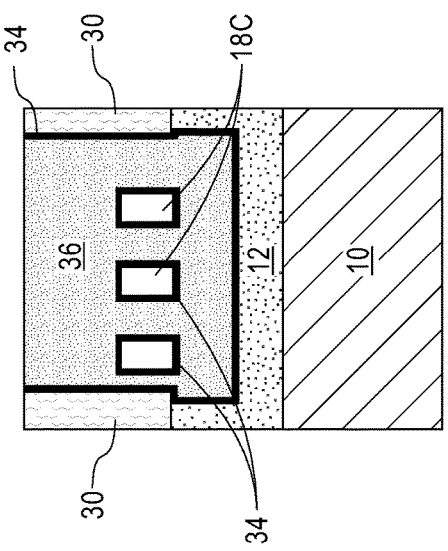
FIG. 5B is a cross-sectional view of the exemplary semiconductor structure of FIG. 5A along line B-B'.

Referring now to FIGS. 5A-5C, there are illustrated the exemplary semiconductor structure of FIGS. 4A-4C after forming a gate dielectric layer portion 34 directly on the bottom surface and sidewall surfaces of a respective gate trench 32 as well as on sidewall surfaces, a top surface and a bottom surface of a channel region 18C of each semiconductor fin 18 and forming a gate electrode layer portion 36 on the gate dielectric layer portion 34.

The gate dielectric layer portion 34 may include a high-k dielectric material having a dielectric constant greater than silicon dioxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, the gate dielectric layer portion 34 may have a multilayer structure comprising different gate dielectric materials, e.g. silicon dioxide, and a high-k gate dielectric material can be formed. The thickness of the gate dielectric layer portion 34 can be from 1 nm to 10 nm, although lesser and greater thicknesses can also be employed.

The gate electrode layer portion 36 may include any conductive metal. Exemplary conductive metals that can be employed in the metal gate electrode layer include, but are not limited to, W, Ti, Ta, Al, Ni, Ru, Pd, and Pt. In one embodiment, the gate electrode layer portion 36 is comprised of W. In some embodiments of the present application, the gate electrode layer portion 36 also contains a work function metal such as, for example, TiAlN, TiN, or TaN.

The gate dielectric layer portion 34 and the gate electrode layer portion 36 can be formed by forming a conformal gate dielectric layer (not shown) on exposed surfaces of the gate trenches 32, the semiconductor fins 18 and the ILD layer 30 and subsequently forming a gate electrode layer (not shown) on the gate dielectric layer to completely fill the gate trenches 32. Each of the gate dielectric layer and gate electrode layer can be formed, for example, by CVD, PECVD, PVD, or ALD. After deposition of the gate electrode layer and the gate dielectric layer, a planarization process such as, for example, CMP, may be performed to remove portions of the gate dielectric layer and the gate electrode layer from above the top surface of the ILD layer 30. A remaining portion of the gate dielectric layer within a respective gate trench 32 constitutes the gate dielectric layer portion 34, while a remaining portion of the gate electrode layer within a respective gate trench 32 constitutes the gate electrode layer portion 36. The top surfaces of the gate electrode layer portion 36 and the gate dielectric layer portion 34 are coplanar with the top surface of the ILD layer 30.

Figure 6A:
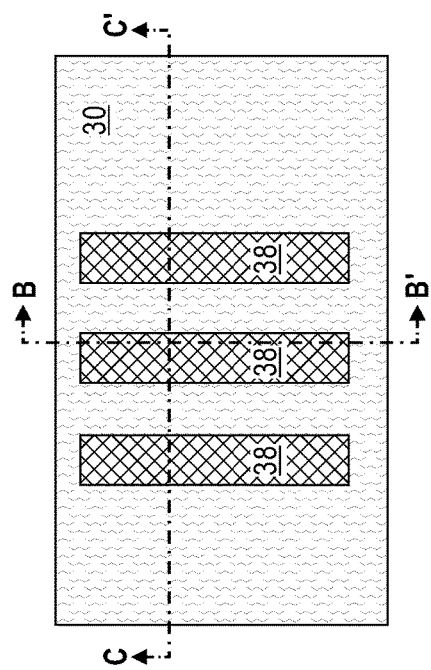
FIG. 6A is a top-down view of the exemplary semiconductor structure of FIGS. 5A-5C after forming a gate structure wrapping around a channel region of each semiconductor fin and forming a gate cap atop the gate structure.
Figure 6C:
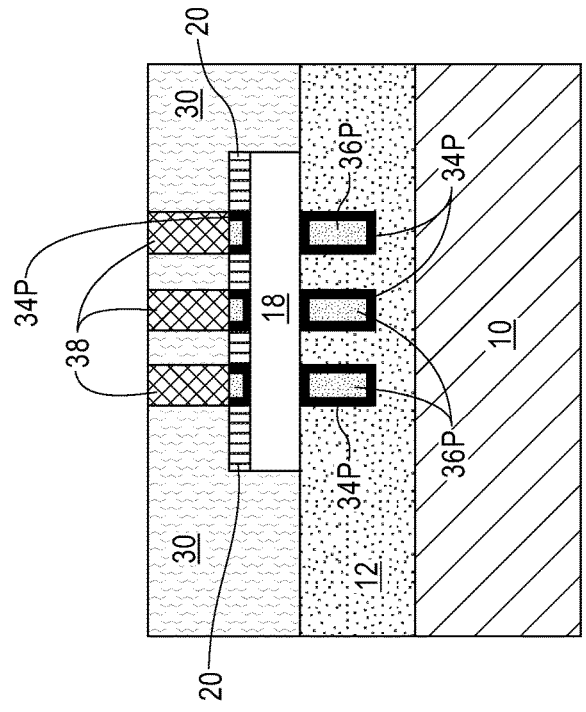
FIG. 6C is a cross-sectional view of the exemplary semiconductor structure of FIG. 6A along line C-C'.
Figure 6B:
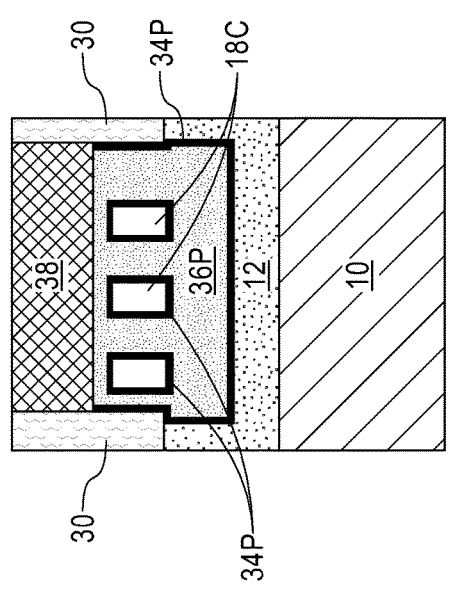
FIG. 6B is a cross-sectional view of the exemplary semiconductor structure of FIG. 6A along line B-B'.

Referring now to FIGS. 6A-6C, there are illustrated the exemplary semiconductor structure of FIGS. 5A-5C after forming a gate structure within each gate trench 32 and wrapping around a channel region 18C of each semiconductor fin 18, and forming a gate cap 38 atop the gate structure. Each gate structure includes a gate dielectric 34P located on exposed surfaces of the semiconductor fins 18 and a gate electrode 36P located over the gate dielectric 34P. Each gate structure (34P, 36P) includes an upper portion located atop a channel regions 18C of each semiconductor fin 18, and a lower portion located within the buried insulator layer 12 and in direct contact with a bottom surface of the channel regions 18C of each semiconductor fin 18. The height of the upper portion of each gate structure (34P, 36P) is typically less than 10 nm. In one embodiment, the top surface of the upper portion of each gate structure (32P, 34P) is coplanar with the top surface of each fin cap 20.

The gate structures (34P, 36P) can be formed by first recessing the gate electrode layer portion 36 below the top surface of the ILD layer 30 by an etch. The etch can be a dry etch or a wet etch that removes the conductive metal that provides the gate electrode portion 36 selective to the dielectric materials that provide the gate dielectric layer portion 34 and the ILD layer 30. A remaining portion of the gate electrode portion 36 located within a respective gate trench 32 constitutes the gate electrode 36P. The gate electrode layer portion 36 may be recessed until a top surface of each gate electrode 36P is coplanar with, or below, the top surface of each fin cap 20. In one embodiment and as shown, the top surface of each gate electrode 36P is coplanar with the top surface of each fin cap 20.

Next, vertical portions of the gate dielectric layer portion 34 are recessed selective to the ILD layer 30. The recessed of the gate dielectric layer portion 34 can be performed by any suitable etching techniques known in the art. In one embodiment and when the gate dielectric layer portion 34 is composed of $HfO_2$, the gate dielectric layer portion 34 may be recessed by a dry etch including $N_2$, $H_2$ and $CF_3$ or a chemical wet etch utilizing an HF etchant. A remaining portion of the gate dielectric portion 34 located within a respective gate trench 32 constitutes the gate dielectric 34P. Within each gate trench 32, the top surface of the gate dielectric 34P is coplanar with the top surface of the gate electrode 36P and a void is formed on top of the gate dielectric 34P and gate electrode 36P.

A dielectric material is then deposited over gate dielectric 34P and gate electrode 36P within each gate trench 32 to completely fill each void. The deposition of the dielectric material can be performed utilizing a deposition process such as, for example, CVD or PECVD. The deposited dielectric material is then planarized, for example, by CMP using the top surface of the ILD layer 30 as an etch stop to form the gate cap 38. Each gate cap 38 thus can have a top surface coplanar with the top surface of the ILD layer 30. Exemplary dielectric materials that can be employed in the gate cap 38 include, but are not limited to, silicon nitride, SiCN, and SiBCN.

Referring now to FIGS. 7A-7C, there are illustrated the exemplary semiconductor structure of FIGS. 6A-6C after forming source/drain contact openings 40 extending through the ILD layer 30 and the fin caps 20. The source/drain contact openings 40 expose sidewalls of the gate structures (34P, 36P) and portions of the semiconductor fins 18 located on opposite sides of the gate structures (34P, 36P). The source/drain contact openings 40 can be formed by applying a photoresist layer (not shown) over the ILD layer 30 and the gate caps 38 and then lithographically patterning the photoresist layer to form openings therein. The openings expose portions of the ILD layer 30 located on opposite sides of the gate caps 38. The physically exposed portions of the ILD layer 30 and underlying portions of fin caps 20 are subsequently removed by at least one etch. The at least one etch can be a dry etch or a wet etch that removes the dielectric materials that provide the ILD layer 30 and fin caps 20 selective to the dielectric materials that provides the gate caps 38 and the gate dielectrics 34P as well as the semiconductor material that provides the semiconductor fins 18. In one embodiment, multiple RIE may be performed. After forming the source/drain contact openings 40, the patterned photoresist layer can be removed, for example, by ashing.

Referring now to FIGS. 8A-8C, there are illustrated the exemplary semiconductor structure of FIGS. 7A-7C after growing an epitaxial source region and an epitaxial drain region (collectively referred to as epitaxial source/drain regions 42) from top and sidewall surfaces of physically exposed portions of semiconductor fins 18 located on opposite sides of each gate structure (34P, 36P). The epitaxial source/drain regions 42 may include any semiconductor material as mentioned above for the semiconductor fins 18. In one embodiment of the present application, the epitaxial source/drain regions 42 include a semiconductor material the same as the semiconductor material that provides the semiconductor fins 18. For example, both the epitaxial source/drain regions 42 and the semiconductor fins 18 may be composed of silicon. In another embodiment of the present application, the epitaxial source/drain regions 42 include a semiconductor material different from the semiconductor material that provides the semiconductor fins 18. For example, the epitaxial source/drain regions 42 may be composed of SiGe and the semiconductor fins 18 may be composed of silicon.

The epitaxial source/drain regions 42 also contain p-type or n-type dopants. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The dopant concentration of the epitaxial source/drain regions 42 can be from $1\times10^{20}$ atoms/cm$^3$ to $1\times10^{22}$ atoms/cm$^3$, although lesser and greater dopant concentration can also be employed.

The epitaxial source/drain regions 42 may be formed by a selective epitaxial growth process. The selective epitaxial growth process grows the semiconductor material that provides epitaxial source/drain regions 42 only from the semiconductor surfaces (i.e., exposed top and sidewall surfaces of the semiconductor fins 18), but not from dielectric surfaces, such as surfaces of the ILD layer 30, the gate caps 38, the fin caps 20 and gate dielectrics 34P. Examples of various epitaxial growth processes that are suitable for use in forming the epitaxial source/drain regions 42 include, but are not limited to, molecular beam epitaxy (MBE) and metal-organic chemical vapor deposition (MOCVD). The dopants can be provided during selective epitaxial growth process by in-situ doping, or after selective epitaxial growth process by ion implantation or gas phase doping. In one embodiment and as shown, the selective epitaxial growth process can be continued until the epitaxial source/drain regions 42 merge neighboring semiconductor fins 18. After epitaxial growth, the top surfaces of epitaxial source/drain regions 42 are located above the bottom surfaces of the gate caps 38.

The dopants in the epitaxial source/drain regions 42 can be activated for example, by a rapid thermal anneal process. In some embodiments of the present application, the annealing may result in a diffusion of dopants from the epitaxial source/drain regions 42 into the portions of the semiconductor fins 20 underlying the epitaxial source/drain regions 42. Doped fin regions 18D thus are formed within portions of the semiconductor fins 18 that are not covered by the gate structures (34P, 36P) to laterally surround the channel region 18C. Collectively, the doped fin region 18D and the doped epitaxial semiconductor region 40 constitute source/drain regions for FETs.

Referring now to FIGS. 9A-9C, there are illustrated the exemplary semiconductor structure of FIGS. 8A-8C after forming source/drain contact structures 50 over the epitaxial source/drain regions 42 to completely fill the source/drain contract openings 40. The source/drain contract structures 50 can be formed by deposition of a conductive material (e.g., tungsten) into the source/drain contract openings 40 and on the top surfaces of the ILD layer 30 and gate caps 38 and by planarization to remove excess portions of the deposited conductive material from above the top surfaces of the ILD layer 30 and the gate caps 38. Optionally, contact liners (not shown) may be formed on the sidewalls the source/drain contact openings 40 and on the top surfaces of the epitaxial source/drain regions 42 before filling the source/drain contact openings 40 with the conductive material. In one embodiment, the contact liners may include titanium.

Since only a minor portion of the gate structure (34P, 36P) is present on top of the semiconductor fin 18, the source/drain contact structures 50 can only form direct contact with the gate cap 38, but not with the gate structure (34P, 36). The overlap between the gate structure (34P, 26P) and the source/drain contact structures 50 is eliminated. As a result, the parasitic capacitance between gate structure and source/drain contact structures can be minimized. In additional, since dielectric spacers are no longer needed in the present application to separate gate structures (34P, 36P) from the source/drain contact structures 50 as is typically the case with prior art structures, a significant area saving can result, and improved FET scaling can be obtained.

Figure 10A:
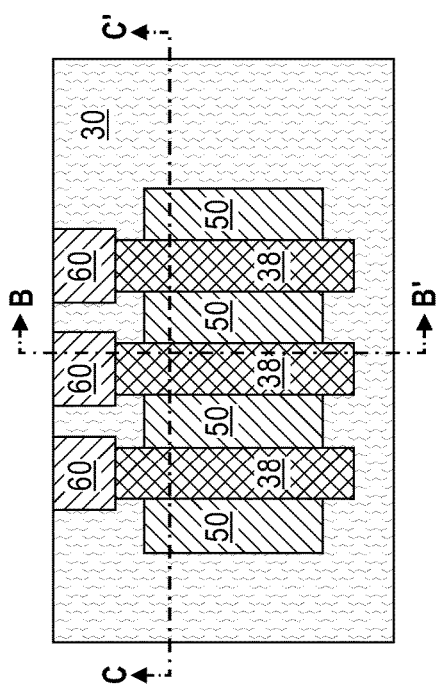
FIG. 10A is a top-down view of the exemplary semiconductor structure of FIGS. 9A-9C after forming gate contact structures.
Figure 10B:
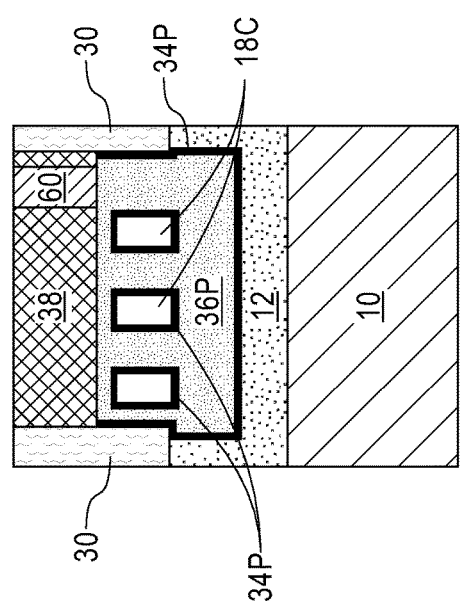
FIG. 10B is a cross-sectional view of the exemplary semiconductor structure of FIG. 10A along line B-B'.
Figure 10C:
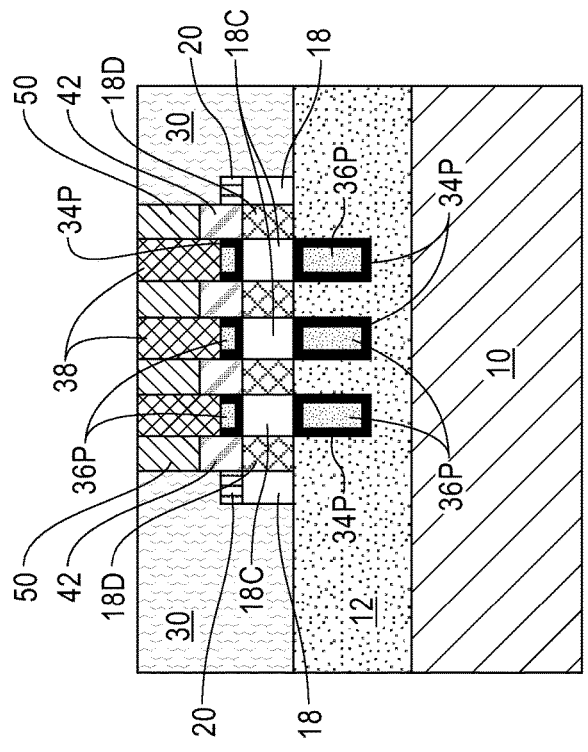
FIG. 10C is a cross-sectional view of the exemplary semiconductor structure of FIG. 10A along line C-C'.

Referring now to FIGS. 10A-10C, there are illustrated the exemplary semiconductor structure of FIGS. 9A-9C after forming gate contract structures 60. Each gate contract structure 60 extends through a gate cap 38 to form direct contract with the gate electrode 34P in a respective gate structure (34P, 36P). The gate contract structures 60 can be formed by formation of gate contact openings (not shown) through the gate caps 38 utilizing a combination of lithographic patterning and anisotropic etch followed by deposition of a conductive material (e.g., tungsten) and planarization that removes excessed portions of the conductive material from above the top surfaces of the ILD layer 30 and the gate caps 38. In some embodiments of the present application, contact liners (not shown) may also be formed on sidewalls and bottom surfaces of the gate contact openings before deposition of the conductive material.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising:
   a semiconductor fin located over a substrate;
   a gate structure wrapping around a channel region of the semiconductor fin, wherein an entirety of a bottom side of the channel region is substantially coplanar with the top surface of the substrate;
   a gate cap located on the gate structure;
   epitaxial source/drain regions located on portions of the semiconductor fin that laterally surround the channel region;
   a fin cap located on end portions of the semiconductor fin and laterally surrounding the epitaxial source/drain regions, wherein topmost surfaces of the gate structure are coplanar with a top surface of the fin cap; and
   source/drain contact structures located on the epitaxial source/drain regions, wherein entire sidewalls of the source/drain contact structures are in contact with sidewalls of the gate cap.

2. The semiconductor structure of claim 1, further comprising an interlevel dielectric (ILD) layer located over the substrate, wherein the ILD layer laterally surrounds the semiconductor fin, the fin cap, the epitaxial source/drain regions and the source/drain contract structures.

3. The semiconductor structure of claim 1, wherein the gate structure comprises an upper portion located above the channel region of the semiconductor fin and a lower portion located beneath the channel region of the semiconductor fin and within the substrate.

4. The semiconductor structure of claim 3, wherein sidewalls of the epitaxial source/drain regions are in contract with sidewalls of the upper portion of the gate structure and sidewalls of a lower portion of the gate cap.

5. The semiconductor structure of claim 3, wherein the gate structure comprises a gate dielectric and a gate electrode.

6. The semiconductor structure of claim 5, wherein a portion of the gate dielectric in the upper portion of the gate structure is U-shaped having a bottom portion in direct contact with a top surface of the channel region of the semiconductor fin, and a portion of the gate electrode in the upper portion of the gate structure is located on the U-shaped portion of the gate dielectric.

7. The semiconductor structure of claim 5, wherein sidewalls of the gate cap are vertically coincident with sidewalls of the gate dielectric.

8. The semiconductor structure of claim 5, further comprising a gate contact structure extending through the gate cap and in contact with the gate electrode.

9. The semiconductor structure of claim 1, further comprising doped fin regions within the portions of the semiconductor fin underlying the epitaxial source/drain regions.

10. A method of forming a semiconductor structure comprising:
    forming an interlevel dielectric (ILD) layer over a semiconductor fin located on a substrate;
    forming a gate trench extending through the ILD layer and into the substrate, wherein a channel region of the semiconductor fin is suspended in the gate trench, wherein an entirety of a bottom side of the channel region is substantially coplanar with a top surface of the substrate;
    forming a gate structure within the gate trench and wrapping around the channel region of the semiconductor fin;
    forming a gate cap on the gate structure and within the gate trench;
    forming source/drain contact openings extending through the ILD layer to expose portions of the semiconductor fin on opposite sides of the gate structure;
    forming epitaxial source/drain regions on the exposed portions of the semiconductor fin, wherein top surfaces of epitaxial source/drain regions are located between a top surface of the gate cap and a bottom surface of the gate cap; and
    forming source/drain contract structures on the epitaxial source/drain regions and within the source/drain contact opening, wherein entire sidewalls of the source/drain contact structures are in contact with sidewalls of the gate cap.

11. The method of claim 10, further comprising forming the semiconductor fin on the substrate, wherein the forming the semiconductor fin comprises:
    providing a semiconductor-on-insulator (SOI) substrate comprising, from bottom to top, a handle substrate, a buried insulator layer and a top semiconductor layer; and
    patterning the top semiconductor layer to provide the semiconductor fin, wherein the handle substrate and the buried insulator layer constitute the substrate and the gate trench extends into the buried insulator layer.

12. The method of claim 11, further comprising forming a dielectric cap layer on the top semiconductor layer; and patterning the dielectric cap layer and the top semiconductor layer to provide a fin stack of the semiconductor fin and a fin cap atop of the semiconductor fin, wherein the ILD layer is formed over the substrate and fin cap, and wherein the gate trench and the source/drain contact openings extend through the fin cap.

13. The method of claim 11, wherein the forming the gate trench comprises:

forming a patterned photoresist layer on the ILD layer;

performing an anisotropic etch to remove portions of the ILD layer and the buried insulator layer that are not covered by the patterned photoresist layer, wherein the channel region of the semiconductor fin is exposed; and performing an isotropic etch to remove portions of the ILD layer located beneath the channel portion of the semiconductor fin.

14. The method of claim 10, wherein a distance between a bottom surface of the gate trench and a bottom surface of the channel region of the semiconductor fin is from 20 nm to 30 nm.

15. The method of claim 10, further comprising diffusing dopants in the epitaxial source/drain regions into the portions of the semiconductor fin on the opposite sides of the gate structure.

16. The method of claim 10, wherein the forming the gate structure comprises:

forming a gate dielectric layer portion on sidewalls and a bottom surface of the gate trench and around the channel portion of the semiconductor;

forming a gate electrode layer portion on the gate dielectric layer to completely fill the gate trench; and recessing the gate electrode layer portion and the gate dielectric layer portion to form a gate dielectric and a gate electrode.

17. The method of claim 16, wherein a distance between topmost surfaces of the gate structure to a top surface of the channel portion of the semiconductor fin is 10 nm.

* * * * *